United States Patent
Wu et al.

(10) Patent No.: US 6,551,938 B1
(45) Date of Patent: Apr. 22, 2003

(54) $N_2/H_2$ CHEMISTRY FOR DRY DEVELOPMENT IN TOP SURFACE IMAGING TECHNOLOGY

(75) Inventors: Tsang-Jiuh Wu, Taichung (TW); Li-Te S. Lin, Hsin-Chu (TW); Li-Chih Chao, Yang-mei (TW)

(73) Assignee: Taiwon Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/056,979

(22) Filed: Jan. 25, 2002

(51) Int. Cl.⁷ ............................................. H01L 21/311
(52) U.S. Cl. ...................................... 438/700; 438/709
(58) Field of Search ..................... 438/706, 707, 438/708, 700, 709, 738, 745, 689, 695, 697

(56) References Cited

U.S. PATENT DOCUMENTS

| | | | |
|---|---|---|---|
| 4,609,614 A | * 9/1986 | Pampalone et al. | 430/323 |
| 5,286,607 A | 2/1994 | Brown | 430/313 |
| 5,700,628 A | 12/1997 | Moslehi | 430/313 |
| 5,922,516 A | 7/1999 | Yu et al. | 430/314 |
| 6,080,678 A | 6/2000 | Yim | 438/725 |
| 6,103,448 A | 8/2000 | Kim et al. | 430/270.1 |
| 6,120,974 A | * 9/2000 | Matsuo et al. | 430/413 |
| 6,255,035 B1 | * 7/2001 | Minter et al. | 430/312 |

* cited by examiner

Primary Examiner—David Nelms
Assistant Examiner—David Nhu
(74) Attorney, Agent, or Firm—George O. Saile; Stephen B. Ackerman; Stephen G. Stanton

(57) ABSTRACT

A method of bi-layer top surface imaging, comprising the following steps. A structure having a lower layer formed thereover is provided. An upper silicon-containing photoresist layer is formed upon the lower layer. The upper silicon-containing photoresist layer is selectively exposed to form upper silicon-containing photoresist layer exposed portions. The upper silicon-containing photoresist layer exposed portions and the portions of the lower layer below the upper silicon-containing photoresist layer exposed portions are removed using an $O_2$-free $N_2/H_2$ plasma etch.

36 Claims, 1 Drawing Sheet

$N_2/H_2$ CHEMISTRY FOR DRY DEVELOPMENT IN TOP SURFACE IMAGING TECHNOLOGY

FIELD OF THE INVENTION

The present invention relates generally to semiconductor fabrication and more specifically to semiconductor fabrication lithographic techniques.

BACKGROUND OF THE INVENTION

As integrated circuit lithography approaches 193 nm wavelength, many process issues occur when applying the conventional single layer photoresist approach. One major issue is the limitation of depth of focus (DOF). Other issues that arise are: due to the weak structure of 193 nm wavelength photoresists (PR); striation of via/trench patterning after etching; contact bird's beak; etc. Another issue, not directly related to the use of 193 nm lithography, is due to the chemical interaction of low dielectric constant (low-k) materials with the deep ultraviolet (DUV) PR itself known as PR poisoning.

The most promising strategy to extend optical lithography to 0.13 $\mu$m and below is the top surface imaging (TSI) technology. Examples of TSI strategies are: multi-layer; silylated single layer; and silylated bi-layer. One common feature of these various TSI technology approaches is the use of plasma to dry develop the PR instead of the wet development in the conventional single layer approaches.

U.S. Pat. No. 6,103,448 to Kim et al. describes a dry develop process for photoresist and shows etching in an $O_2$ plasma.

U.S. Pat. No. 5,286,607 to Brown describes a bi-layer resist process.

U.S. Pat. No. 6,080,678 to Yim describes a method for etching an anti-reflective coating (ARC) film.

U.S. Pat. No. 6,120,974 to Matsuo et al. describes a pattern forming material including a binary copolymer and a pattern forming method.

U.S. Pat. No. 5,922,516 to Yu et al. describes a bi-layer silylation process.

U.S. Pat. No. 5,700,628 to Moslehi describes a dry microlithography process.

SUMMARY OF THE INVENTION

Accordingly, it is an object of an embodiment of the present invention to provide an improved method of top surface imaging (TSI) lithography.

Other objects will appear hereinafter.

It has now been discovered that the above and other objects of the present invention may be accomplished in the following manner. Specifically, a structure having a lower layer formed thereover is provided. An upper silicon-containing photoresist layer is formed upon the lower layer. The upper silicon-containing photoresist layer is selectively exposed to form upper silicon-containing photoresist layer exposed portions. The upper silicon-containing photoresist layer exposed portions and the portions of the lower layer below the upper silicon-containing photoresist layer exposed portions are removed using an $O_2$-free $N_2/H_2$ plasma etch.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Process Known to the Inventors

The following process is known to the inventors and is not to be considered prior art for the purposes of this invention.

One practice used in the bi-layer approach utilizes thin silicon-containing resist as the top layer and a thick organic material resist as the bottom layer. Patterns are developed in the thin top silicon-containing resist layer and are then transferred into the bottom thick organic material resist layer using an $O_2$-based plasma etch process which also converts the silicon (Si) in the top resist layer is converted into a silicon oxide-like material. Thus, the top image layer acts as a hard mask during the transfer etch.

This feature of using a thinner top image layer can effectively extend the limitations of 193 nm lithography and reduce striation of the subsequent trench/via pattern. Further, using a dry development can also provide a total solution to PR poisoning.

Some $O_2$-based dry development chemistry includes $O_2/SO_2$, $O_2/N_2$, and $O_2/CO$ plasmas etc. However, fundamental problem issues in plasma dry development are; (1) critical dimension (CD) enlargement; (2) profile bowing; (3) line edge roughness; and (4) residue formation. Further, although $O_2/SO_2$ plasma dry development methods are widely studied in literature, it is not suitable to use sulfur-containing chemistry due to copper (Cu) damage issues in back-end of line (BEOL) copper processes.

Initial Structure

The method of the present invention utilizes bi-layer top surface imaging (TSI) technology.

Figure 1:
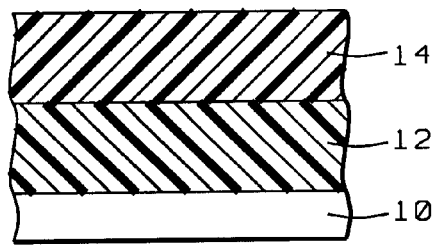
FIGS. 1 to 4 schematically illustrate a preferred embodiment of the present invention.

FIG. 1 illustrates a structure 10 having formed thereover a lower layer 12 formed to a thickness of preferably from about 3000 to 7000 Å and more preferably from about 4000 to 5000 Å.

Structure 10 is preferably a silicon substrate with an upper overlying dielectric layer such as silicon oxide and is understood to possibly include a semiconductor wafer or substrate with an upper overlying dielectric layer, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

The upper dielectric layer of structure 10 may be an intermetal dielectric (IMD) layer or an interlevel dielectric (ILD) layer and may be comprised of oxynitride, carbide, oxide or nitride, for example.

Lower layer 12 functions as a kind of organic resin for etching resistance and is preferably formed of positive or negative organic photoresist (PR) which are not sensitive to photo wavelength, preferably such as 248 nm PR in 193 nm Era. Lower layer 12 may also be comprised of a non-photoresist organic material etchable by an $O_2$-free chemistry in a plasma dry development process such as a BARC (bottom anti-reflective coating) layer.

Upper silicon (Si)-containing photoresist (PR) layer 14 is formed over lower layer to a thickness of preferably from about 1000 to 3000 Å and more preferably from about 1500 to 2500 Å. Upper Si-containing photoresist layer 14 is sensitive to photo wavelength.

Exposure of Upper Positive Si-Containing Photoresist Layer 14

Figure 2:
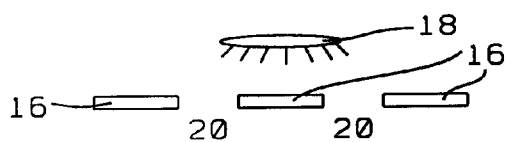
Figure 2:
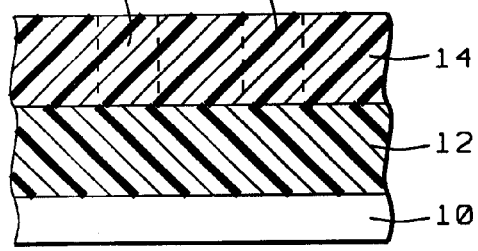

As shown in FIG. 2, the upper positive Si-containing photoresist layer 14 is exposed using, for example, a mask 16 and a light source 18 to create exposed portions 20 within upper PR layer 14. Upper PR layer 14 may be exposed with a 193 nm wavelength light for example.

Oxygen-Free Development of Exposed Photoresist Layer 14 and Etching of Lower Layer 12

Figure 3:
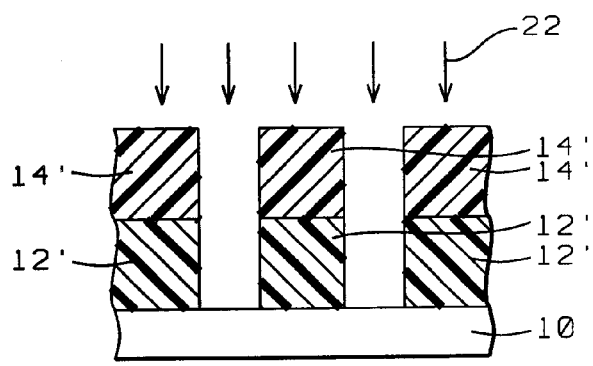

In a key step of the invention and as shown in FIG. 3, the structure is subjected to a one-step $O_2$-free $N_2/H_2$ plasma etch 22 at a pressure of preferable less than about 110 mTorr and more preferably less than about 100 mTorr to dry develop the exposed portions 20 of upper Si-containing PR layer 14 and then, using the unexposed portions of upper PR layer 14' as a mask, etching the lower layer 12 below the exposed upper Si-containing PR layer portions 20 to form etched lower layer 12'.

Although not definitive, the inventors believe that the $O_2$-free $N_2/H_2$ plasma etch 22 may convert the non-exposed portions of upper Si-containing PR layer 14 to silicon nitride (SiN) which then serve as hard masks in etching the lower layer 12 not below the SiN portions of upper layer 14.

The $O_2$-free $N_2/H_2$ plasma etch 22 is conducted at the following parameters;

temperature: preferably from about −100 to 50° C. and more preferably from about 0 to 25° C.;

pressure: preferably less than about 110 mTorr and more preferably less than about 100 mTorr;

$N_2:H_2$ ratio: preferably from about 2:1 to 1:10; more preferably from about 1:1 to 1:5; and most preferably about 1:2;

bias power: preferably from about 20 to 500 watts and more preferably from about 50 to 250 watts; and total gas flow: preferably from about 20 to 2000 sccm and more preferably from about 50 to 1000 sccm.

Etching of the Upper Dielectric Layer of Structure 10

Figure 4:
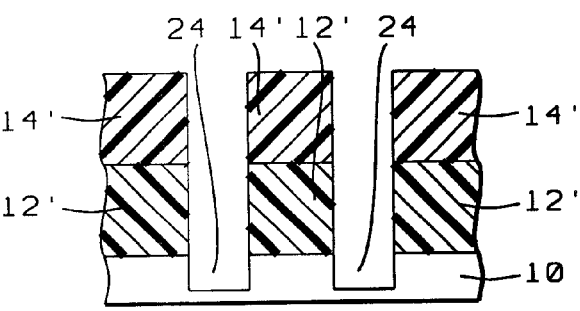

As shown in FIG. 4, patterned upper PR layer 14' and etched lower layer 12' are used as masks to etch the upper dielectric layer of structure 10 to form dielectric layer openings 24. Patterned upper PR layer 14' is removed during this etch process.

Openings 24 may be, for example, trenches, shallow trench isolation (STI) structure openings, via openings or contact openings.

As confirmed by experiments conducted by the inventors, the dielectric layer trenches 24 have been found to have: zero critical dimension (CD) bias; a vertical profile; no residue; and no striation.

Advantages of the Present Invention

The advantages of the present invention include:

1. vertical profile is achieved with no bowing;
2. no striation is achieved;
3. good CD control (zero bias) is achieved; and
4. no residue is formed.

While particular embodiments of the present invention have been illustrated and described, it is not intended to limit the invention, except as defined by the following claims.

We claim:

1. A method of bi-layer top surface imaging, comprising the steps of:

providing a structure having a lower organic layer formed thereover;

forming an upper silicon-containing photoresist layer upon the lower organic layer;

selectively exposing the upper silicon-containing photoresist layer to form upper silicon-containing photoresist layer exposed portions; and removing the upper silicon-containing photoresist layer exposed portions and the portions of the lower organic layer below the upper silicon-containing photoresist layer exposed portions using an $O_2$-free $N_2/H_2$ plasma etch.

2. The method of claim 1, wherein the $O_2$-free $N_2/H_2$ plasma etch is conducted at a pressure of less than about 110 mTorr.

3. The method of claim 1, wherein the $O_2$-free $N_2/H_2$ plasma etch is conducted at a pressure of less than about 100 mTorr.

4. The method of claim 1, wherein the $O_2$-free $N_2/H_2$ plasma etch is conducted at:

a pressure of less than about 110 mTorr;

a temperature of from about −100 to 50° C.;

an $N_2:H_2$ ratio of from about 2:1 to 1:10;

a bias power: of from about 20 to 500 watts; and a total gas flow of from about 20 to 2000 sccm.

5. The method of claim 1, wherein the $O_2$-free $N_2/H_2$ plasma etch is conducted at:

a pressure of less than about 100 mTorr;

a temperature of from about 0 to 25° C.;

an $N_2:H_2$ ratio of from about 1:1 to 1:5;

a bias power of from about 50 to 250 watts; and a total gas flow of from about 50 to 1000 sccm.

6. The method of claim 1, wherein the structure in includes an upper dielectric layer; the lower organic layer is comprised of a material selected from the group consisting of 248 nm photoresist and 193 nm photoresist.

7. The method of claim 1, wherein the structure in includes an upper dielectric layer; the lower organic layer is comprised of an organic resin.

8. The method of claim 1, wherein the structure in includes an upper dielectric layer; the lower organic layer is comprised of positive or negative photoresist; and the upper Si-containing photoresist layer is a positive photoresist.

9. The method of claim 1, wherein the lower organic layer has a thickness of from about 3000 to 7000 Å; and the upper silicon-containing photoresist layer has a thickness of from about 1000 to 3000 Å.

10. The method of claim 1, wherein the lower organic layer has a thickness of from about 4000 to 5000 Å; and the upper silicon-containing photoresist layer has a thickness of from about 1500 to 2500 Å.

11. The method of claim 1, wherein the upper silicon-containing photoresist layer is selectively exposed by a 193 nm wavelength light source.

12. The method of claim 1, including the step of using the etched upper silicon-containing photoresist layer and the etched lower organic layer as a mask to etch the structure to form openings.

13. The method of claim 1, including the step of using the etched upper silicon-containing photoresist layer and the etched lower organic layer as a mask to etch the structure to form openings having:

zero critical dimension (CD) bias;

a vertical profile;

no residue; and no striation.

14. A method of bi-layer top surface imaging, comprising the steps of:
   providing a structure having a lower organic layer formed thereover;
   forming an upper silicon-containing photoresist layer upon the lower organic layer;
   selectively exposing the upper silicon-containing photoresist layer to form upper silicon-containing photoresist layer exposed portions; and
   removing the upper silicon-containing photoresist layer exposed portions and the portions of the lower organic layer below the upper silicon-containing photoresist layer exposed portions using an $O_2$-free $N_2/H_2$ plasma etch conducted at a pressure of less than about 110 mTorr.

15. The method of claim 14, wherein the $O_2$-free $N_2/H_2$ plasma etch is conducted at a pressure of less than about 100 mTorr.

16. The method of claim 14, wherein the $O_2$-free $N_2/H_2$ plasma etch is conducted at:
   a pressure of less than about 110 mTorr;
   a temperature of from about −100 to 50° C.;
   an $N_2:H_2$ ratio of from about 2:1 to 1:10;
   a bias power: of from about 20 to 500 watts; and
   a total gas flow of from about 20 to 2000 sccm.

17. The method of claim 14, wherein the $O_2$-free $N_2/H_2$ plasma etch is conducted at:
   a pressure of less than about 100 mTorr;
   a temperature of from about 0 to 25° C.;
   an $N_2:H_2$ ratio of from about 1:1 to 1:5;
   a bias power of from about 50 to 250 watts; and
   a total gas flow of from about 50 to 1000 sccm.

18. The method of claim 14, wherein the structure in includes an upper dielectric layer; the lower organic layer is comprised of a material selected from the group consisting of 248 nm photoresist and 193 nm photoresist.

19. The method of claim 14, wherein the structure in includes an upper dielectric layer; the lower organic layer is comprised of an organic resin.

20. The method of claim 14, wherein the structure in includes an upper dielectric layer; the lower organic layer is comprised of positive or negative photoresist; and the upper Si-containing photoresist layer is a positive photoresist.

21. The method of claim 14, wherein the lower organic layer has a thickness of from about 3000 to 7000 Å; and the upper silicon-containing photoresist layer has a thickness of from about 1000 to 3000 Å.

22. The method of claim 14, wherein the lower organic layer has a thickness of from about 4000 to 5000 Å; and the upper silicon-containing photoresist layer has a thickness of from about 1500 to 2500 Å.

23. The method of claim 14, wherein the upper silicon-containing photoresist layer is selectively exposed by a 193 nm wavelength light source.

24. The method of claim 14, including the step of using the etched upper silicon-containing photoresist layer and the etched lower organic layer as a mask to etch the structure to form openings.

25. The method of claim 14, including the step of using the etched upper silicon-containing photoresist layer and the etched lower organic layer as a mask to etch the structure to form openings having:
   zero critical dimension (CD) bias;
   a vertical profile;
   no residue; and
   no striation.

26. A method of bi-layer top surface imaging, comprising the steps of:
   A providing a structure having a lower organic layer formed thereover;
   forming an upper silicon-containing photoresist layer upon the lower organic layer;
   selectively exposing the upper silicon-containing photoresist layer to form upper silicon-containing photoresist layer exposed portions; and
   removing the upper silicon-containing photoresist layer exposed portions and the portions of the lower organic layer below the upper silicon-containing photoresist layer exposed portions using an $O_2$-free $N_2/H_2$ plasma etch conducted at:
      a pressure of less than about 110 mTorr;
      a temperature of from about −100 to 50° C.;
      an $N_2:H_2$ ratio of from about 2:1 to 1:10;
      a bias power: of from about 20 to 500 watts; and
      a total gas flow of from about 20 to 2000 sccm.

27. The method of claim 26, wherein the $O_2$-free $N_2/H_2$ plasma etch is conducted at a pressure of less than about 100 mTorr.

28. The method of claim 26, wherein the $O_2$-free $N_2/H_2$ plasma etch is conducted at:
   a pressure of less than about 100 mTorr;
   a temperature of from about 0 to 25° C.;
   an $N_2:H_2$ ratio of from about 1:1 to 1:5;
   a bias power of from about 50 to 250 watts; and
   a total gas flow of from about 50 to 1000 sccm.

29. The method of claim 26, wherein the structure in includes an upper dielectric layer; the lower organic layer is comprised of a material selected from the group consisting of 248 nm photoresist and 193 nm photoresist.

30. The method of claim 26, wherein the structure in includes an upper dielectric layer; the lower organic layer is comprised of an organic resin.

31. The method of claim 26, wherein the structure in includes an upper dielectric layer; the lower organic layer is comprised of positive or negative photoresist; and the upper Si-containing photoresist layer is a positive photoresist.

32. The method of claim 26, wherein the lower organic layer has a thickness of from about 3000 to 7000 Å; and the upper silicon-containing photoresist layer has a thickness of from about 1000 to 3000 Å.

33. The method of claim 26, wherein the lower organic layer has a thickness of from about 4000 to 5000 Å; and the upper silicon-containing photoresist layer has a thickness of from about 1500 to 2500 Å.

34. The method of claim 26, wherein the upper silicon-containing photoresist layer is selectively exposed by a 193 nm wavelength light source.

35. The method of claim 26, including the step of using the etched upper silicon-containing photoresist layer and the etched lower organic layer as a mask to etch the structure to form openings.

36. The method of claim 26, including the step of using the etched upper silicon-containing photoresist layer and the etched lower organic layer as a mask to etch the structure to form openings having:
   zero critical dimension (CD) bias;
   a vertical profile;
   no residue; and
   no striation.

* * * * *

UNITED STATES PATENT AND TRADEMARK OFFICE
CERTIFICATE OF CORRECTION

PATENT NO. : 6,551,938 B1
DATED : April 22, 2003
INVENTOR(S) : Tsang-Jiuh Wu, Li-Te S. Lin and Li-Chih Chao It is certified that error appears in the above-identified patent and that said Letters Patent is hereby corrected as shown below:

<u>Title page,</u>
Item [73], Assignee, delete "Taiwon Semiconductor Manufacturing Company, Hsin-Chu (TW)", and replace with -- Taiwan Semiconductor Manufacturing Company, Hsin-Chu (TW) --.

Signed and Sealed this

Twenty-second Day of June, 2004

JON W. DUDAS
*Acting Director of the United States Patent and Trademark Office*